(12) United States Patent
Pirhonen et al.

(10) Patent No.: US 7,420,948 B2
(45) Date of Patent: Sep. 2, 2008

(54) DATA TRANSMISSION METHOD

(75) Inventors: Riku Pirhonen, Flower Mound, TX (US); Pekka Ranta, Nummela (FI); Jyri Suvanen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/221,797

(22) Filed: Sep. 9, 2005

(65) Prior Publication Data

US 2006/0002363 A1    Jan. 5, 2006

Related U.S. Application Data

(63) Continuation of application No. 09/066,359, filed as application No. PCT/FI96/00585 on Oct. 31, 1996, now Pat. No. 6,970,441.

(30) Foreign Application Priority Data

Oct. 31, 1995  (FI) .................................. 955206

(51) Int. Cl.
*H04B 7/216*    (2006.01)
(52) U.S. Cl. ...................... 370/335; 714/786
(58) Field of Classification Search .............. None
See application file for complete search history.

(56) References Cited

U.S. PATENT DOCUMENTS

| | | | |
|---|---|---|---|
| 4,049,917 A * | 9/1977 | Copperi et al. .......... 370/479 |
| 4,972,411 A | 11/1990 | Fushimi et al. | |
| 5,029,331 A | 7/1991 | Heichler | |
| 5,208,816 A | 5/1993 | Seshardi et al. | |
| 5,383,219 A | 1/1995 | Wheatley, III | |
| 5,430,724 A | 7/1995 | Fall | |
| 5,438,590 A | 8/1995 | Tzukerman | |
| 5,483,531 A | 1/1996 | Jouin | |
| 5,563,895 A | 10/1996 | Malkamaki et al. | |
| 5,648,967 A | 7/1997 | Schulz | |
| 5,668,820 A | 9/1997 | Ramesh et al. | |

(Continued)

FOREIGN PATENT DOCUMENTS

EP    0 660 558 A2    6/1995

OTHER PUBLICATIONS

LEE, "New Rate-Compatible Punctured Convolutional Codes for Viterbi Decoding", IEEE Transactions on Communications, vol. 42 (No. 12), pp. 3073-3079, (Dec. 1994).

(Continued)

*Primary Examiner*—Firmin Backer
*Assistant Examiner*—Toan Nguyen
(74) *Attorney, Agent, or Firm*—Pillsbury Winthrop Shaw Pittman LLP

(57) ABSTRACT

The invention relates to a data transfer method in a digital cellular radio network, the method comprising channel coding the information to be transferred for transmission. In order to implement a data rate of 14.4 kbit/s in GSM type of cellular radio systems by employing one time slot only for data transmission, the channel coding according to the method of the invention comprises grouping bits to be transmitted in blocks having the minimum size of 288 bits, carrying out convolutional coding for the blocks with a code rate of ½ by using GSM convolutional coding polynomes, and puncturing the bits obtained by deleting bits from each block so that blocks containing no more than 456 bits will be obtained.

5 Claims, 8 Drawing Sheets

U.S. PATENT DOCUMENTS 5,724,380 A * 3/1998 Ritter ......................... 375/135
5,812,951 A * 9/1998 Ganesan et al. ............. 455/445
5,815,809 A    9/1998 Ward et al.
6,597,917 B1   7/2003 Meuronen

OTHER PUBLICATIONS

Yasuda et al., "High Rate Punctured Convulutional Codes for Soft Decision Viterbi Decoding", IEEE Transactions on Communications, vol. COM-32 (No. 3), pp. 315-319, (Mar. 1984).

* cited by examiner

DATA TRANSMISSION METHOD

This is a continuation of U.S. patent application Ser. No. 09/066,359, filed Aug. 18, 1998, (now U.S. Pat. No. 6,970,441), which is a U.S. National Stage of International Application No. PCT/FI96/00585, filed Oct. 31, 1996, which relies for priority upon Finnish Patent Application No. 955206, filed Oct. 31, 1995, the contents of all of which are incorporated herein by reference in their entireties.

FIELD OF THE INVENTION

The present invention relates to a data transmission method in a digital cellular radio network, the method comprising the step of channel coding the information to be transferred for transmission.

PRIOR ART

Requirements set for data transmission methods are continuously increasing. This particularly concerns wireless data transmission systems, such as cellular communication systems of which ever more versatile services are required, such as various kinds of data services.

Conventionally, wireless data transmission systems have only been used for speech transmission. An increase in the number of various kinds of services to be transferred means, as far as wireless services in particular are concerned, that the system must be able to transmit signals with different capacities over the radio path. Consequently, an efficient operation is required of the data transmission system in an environment where transmissions of a multitude of service types are transferred.

Data transmission on a radio channel with a limited bandwidth is a kind of compromise between bit error rate, indicating transmission quality, and a net user data throughput. The bit error rate may be decreased by increasing channel coding which adds redundancy, i.e. information less important from the point of view of the user, to the information to be transmitted. If the number of bits to be transmitted in a time unit is restricted, the net user data throughput is reduced with redundancy.

For example in the GSM system, the data rate of a full rate channel is 22.8 kbit/s on the radio path. The coding methods used reduce the data rate to 12 kbit/s and 6 kbit/s, which correspond to user data rates of 9.6 kbit/s and 4.8 kbit/s, i.e. the services TCH/F9.6 and TCH/F4.8. The output data to be transmitted over the radio path is transferred forward from base stations to base station controllers and the center, and the input data, in turn, from the center to a base station controller and further to a base station for transmission over the radio path. On such fixed transmission links, transmission errors are much less probable than on the radio path, and that is why there is usually no need to employ a particular error-correcting coding on them. To minimize transmission costs, it is beneficial to perform rate adaptation to the lowest data rate employed by the system, for example to 16 kbit/s in the case of TCH/F9.6. FIG. 1 illustrates a TRAU frame which is important from the point of view of implementing the rate adaptation, i.e. the frame in which the user data is transmitted on the fixed connections between a base station and a TRAU (Transcoder/Rate Adaptation Unit). The frame comprises 40 octets.

Synchronization bits are marked with S, bits assigned to user data with D, and control and spare bits have been left white.

Apart from the intentional redundancy described above, present-day GSM data services have spare data in the user information. In a transparent service, the surplus is constituted by flux control signalling, and in a non-transparent service by radio link protocol (RLP) frame headers and L2R flux control. In both cases, the user will have a date rate of no more than 9.6 kbit/s or 4.8 kbit/s to use, depending on whether a TCH/F9.6 or a TCH/F4.8 service is in question. At this moment, the user has no access to a higher data rate in GSM type of networks, even though high demands exist for this with data services becoming more common.

There are several apparatuses requiring higher data rates, because the data rates in fixed data networks have been higher. A typical data rate employed in fixed telephone networks is 14.4 kbit/s, which e.g. ITU V.32 bis and V.34 modems and telefax terminals of group 3 may use.

In the GSM type of networks, the aim is to implement higher data rates in the near future, and currently it is known to apply a so-called multi-slot technique for this purpose. This means that more than one time-slot could be assigned to users, with the natural result of an increased user data rate. Utilizing many time-slots is technically complicated to implement, particularly in mobile stations, and especially if the number of time-slots exceeds two.

CHARACTERISTICS OF THE INVENTION

It is an object of the present invention to implement a data rate of 14.4 kbit/s in cellular radio systems of the GSM type so that only one time-slot is used for transmitting user data.

This object is achieved by a method of the type set forth in the introduction, characterized in that channel coding comprises grouping bits to be transmitted in blocks having the minimum size of 288 bits, carrying out convolutional coding for said blocks with a code rate of ½ by using GSM convolutional coding polynomes, and puncturing the bits obtained by deleting bits from each block so that blocks containing no more than 456 bits will be obtained.

The method according to the invention provides a multitude of advantages. By the method of the invention, a desired data rate may be achieved without any large-scale modifications to existing networks. As the user needs one time-slot only, the resources and capacity of the network are used efficiently.

In the preferred embodiment of the invention, the information to be transmitted is transcoded by combining two subsequent transcoding frames into one frame, and by using some of the bits that would in case of individual frames be used for synchronizing the latter frame for transferring the information to be transmitted in this case. In a second preferred embodiment of the invention, the information to be transmitted is transcoded so that when generating the transcoding frame, comprising a group of data octets, the first bit of each data octet is used for transferring the information to be transmitted.

DESCRIPTION OF THE DRAWINGS

In the following, the invention will be described in more detail with reference to the accompanying drawings, in which.

DESCRIPTION OF THE PREFERRED EMBODIMENTS

Figure 2:
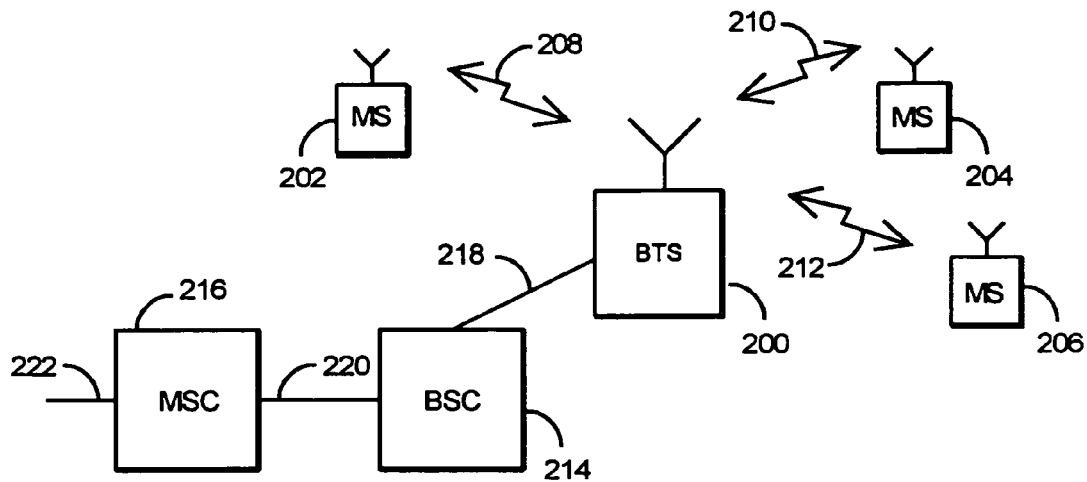
FIG. 2 illustrates a cellular radio system to which the method according to the invention may be applied.

FIG. 2 illustrates the structure of a cellular radio system of the GSM type. The invention may advantageously be applied to a digital cellular radio system whose channel and frame structure resembles the GSM system. The system comprises a group of terminal equipments 202-206 which have a connection 208-212 to a base station 200. The base station 200 communicates via digital transmission links 218 with a base station controller 214, which has one or more base stations under its control. The base station controller 214, in turn, communicates via digital transmission links 220 with a mobile services switching center 216, which has a further connection 222 to other parts of the network.

Figure 3A:
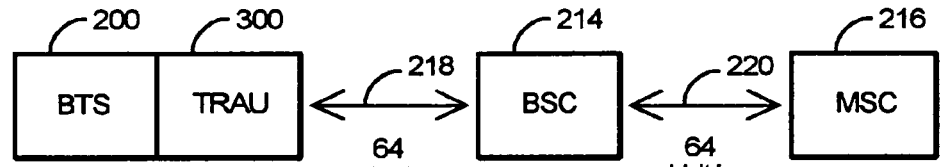
FIGS. 3a-3c illustrate alternative locations for the transcoding unit.
Figure 3B:
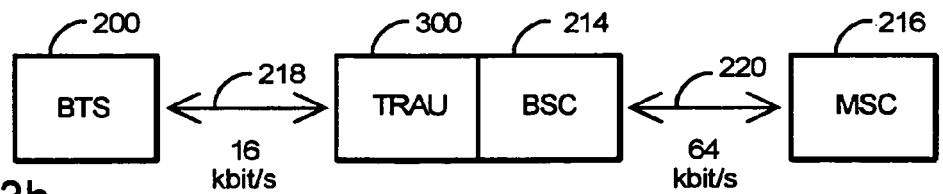
Figure 3C:
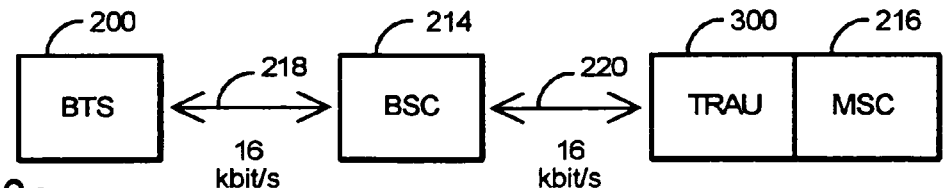

The interface 218 between the base station 200 and the base station controller 214 is referred to as an Abis interface. Similarly, the interface 220 between the base station controller 214 and the mobile services switching center is referred to as an A interface. There are two common ways to implement these interfaces. What is essential to both these ways is the transfer rate used at the Abis interface, which is either 64 kbit/s or 16 kbit/s. For the 64 kbit/s transfer rate employed for switching by the center 216, the signal must be transcoded, and thus the location of the transcoding unit TRAU in the network depends on the transfer rate employed at the Abis interface. FIGS. 3a-3c illustrate different alternatives for the network structure at different transfer rates.

FIG. 3a illustrates an alternative in which the Abis interface 218 between the base station 200 and the base station controller 214 is implemented at the rate of 64 kbit/s. In such a case, the transcoding unit TRAU 300 is located at the base station 200. This means that the connection 220 between the base station controller 214 and the mobile services switching center 216 is also 64 kbit/s.

FIG. 3b illustrates an alternative in which the Abis interface 218 between the base station 200 and the base station controller 214 is implemented at the rate of 16 kbit/s. In such a case, the transcoding unit TRAU 300 is located at the base station controller 214. This means that the connection 220 between the base station controller 214 and the mobile services switching center 216 has the rate of 64 kbit/s.

FIG. 3c illustrates a second alternative in which the Abis interface 218 between the base station 200 and the base station controller 214 is implemented at the rate of 16 kbit/s. The transcoding unit TRAU 300 in this case is located at the mobile services switching center 216. The connection 220 between the base station controller 214 and the mobile services switching center 216 is thereby 16 kbit/s.

In the method according to the invention, the aim of which is to enable a higher transfer rate for the user data in a cellular radio system, a new way is introduced for carrying out coding both on the radio path and in the transcoding unit described above. The modifications caused by the new coding on existing systems remain small, but they enable a 14.4 kbit/s transfer rate for the user. The method of the invention will below be first examined in connection with transcoding.

Figure 4A:
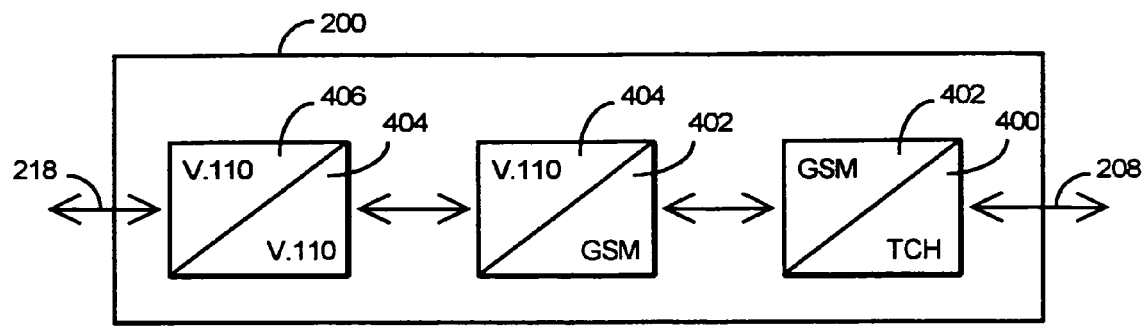
FIGS. 4a and 4b illustrate transforming of data rate at different Abis interfaces.
Figure 4B:
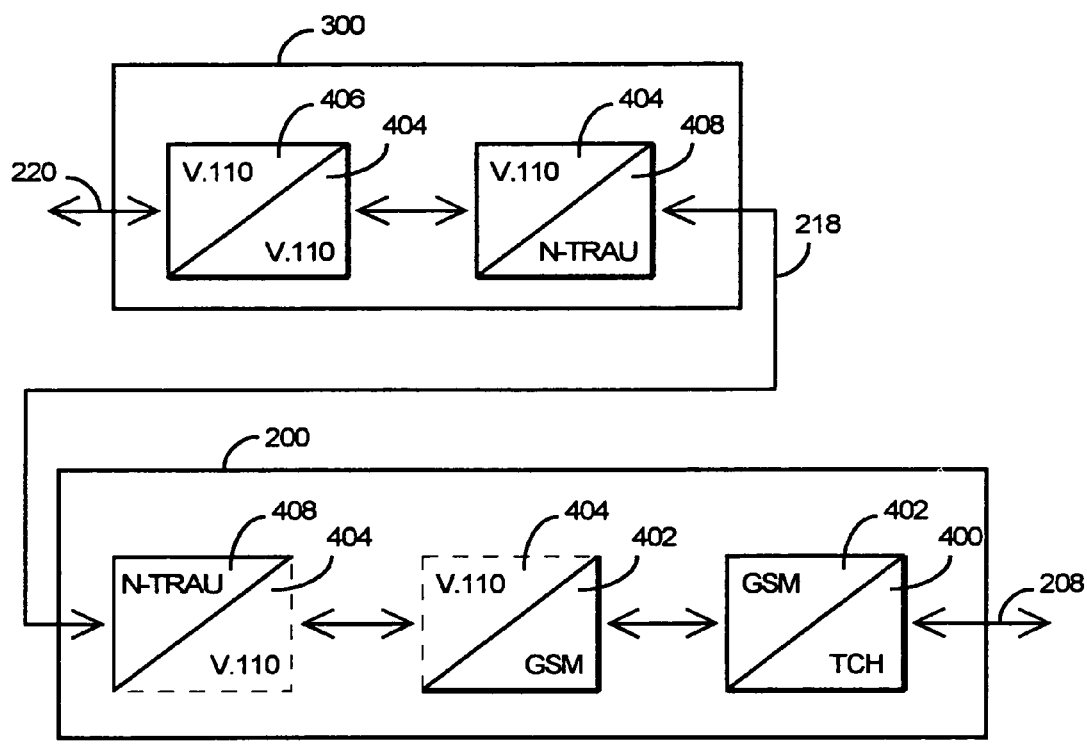

FIGS. 4a and 4b illustrate a transformation in the transfer rate with different Abis interfaces. FIG. 4a illustrates network implementation in case of a 64 kbit/s Abis interface 218. In such a case transcoding is carried out in connection with the base station 200 and is a linear process utilizing ITU-T V.110 rate transformation specification. The signal received from the radio path 208 has been coded according to specifications of the traffic channel 400 at the rate of 22.8 kbit/s. The user data rate 402 is consequently 14.4 kbit/s which is first transformed to the rate of 32 kbit/s 404 according to V.110 recommendations, and from that further to the rate of 64 kbit/s 406. As the transcoder is in this case located at the base station 200, there is no need for separate TRAU frames.

FIG. 4b illustrates a network implementation with a 16 kbit/s Abis interface. In this case the transcoder 300 is external to the base station 200, and therefore traffic over the Abis interface 218 takes place by TRAU frames. As there exists no rate transformation scheme from a user rate of 14.4 kbit/s to the rate of 16 kbit/s at the Abis interface, the method of the invention comprises a new transformation and a TRAU frame corresponding thereto. The signal received from the radio path 208 has been coded according to specifications of the traffic channel 400 at the rate of 22.8 kbit/s. The user data rate 402 is therefore 14.4 kbit/s, which is transformed 404 according to V.110 specifications to an intermediate rate of 32 kbit/s. For the Abis interface, a new type of 16 kbit/s TRAU frame 408 is generated which is herein referred to as an N-TRAU frame. In the transcoding unit the N-TRAU frame is disassembled according to V.110 recommendations via 404 an intermediate rate of 32 kbit/s to the rate of 64 kbit/s 406. In the above, it is not compulsory to use the intermediate rate of 32 kbit/s in the base station 200.

Figure 1:
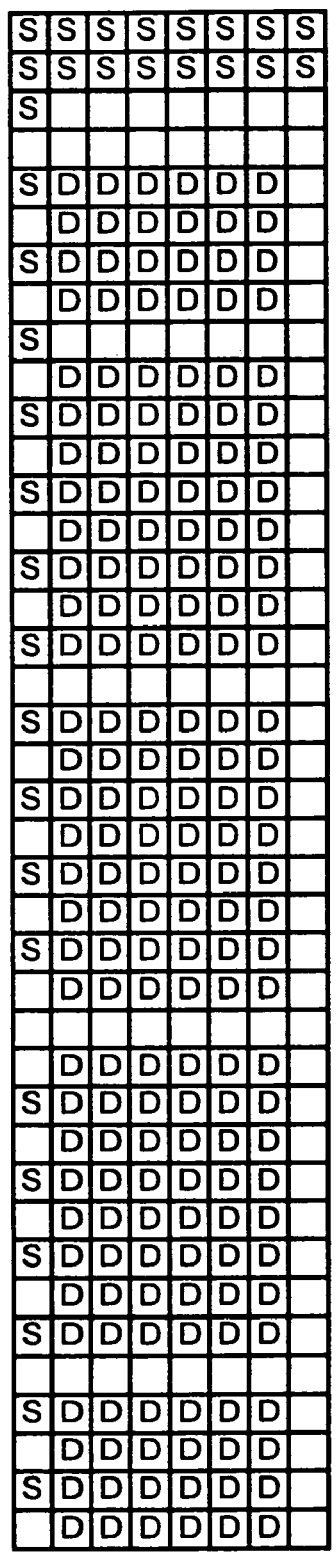
FIG. 1 illustrates a conventional TRAU frame described above.

The TRAU frame is transmitted over the Abis interface at 20 ms intervals, and it contains 320 bits in all. If the desired user data rate is 14.4 kbit/s, 288 bits of data bits should be transmitted within 20 ms. There are four different known transcoding frames used in the GSM system, one of which is illustrated in FIG. 1. None of these frames utilizes the 16 kbit/s capacity in the best possible way. If all available data bits are employed of the known frames, except the spare control bits, 270 bits will be obtained. If 9 spare bits are included from the control field of the data frame, 279 bits will be obtained, which is not enough.

The method according to the invention utilizes two new type of transcoding frame alternatives, in which bits intended for synchronization are employed in data transmission. Further in the method according to the invention, synchronization of the transcoding frame is changed so as to obtain synchronization with a smaller number of actual synchronization bits.

Figure 5:
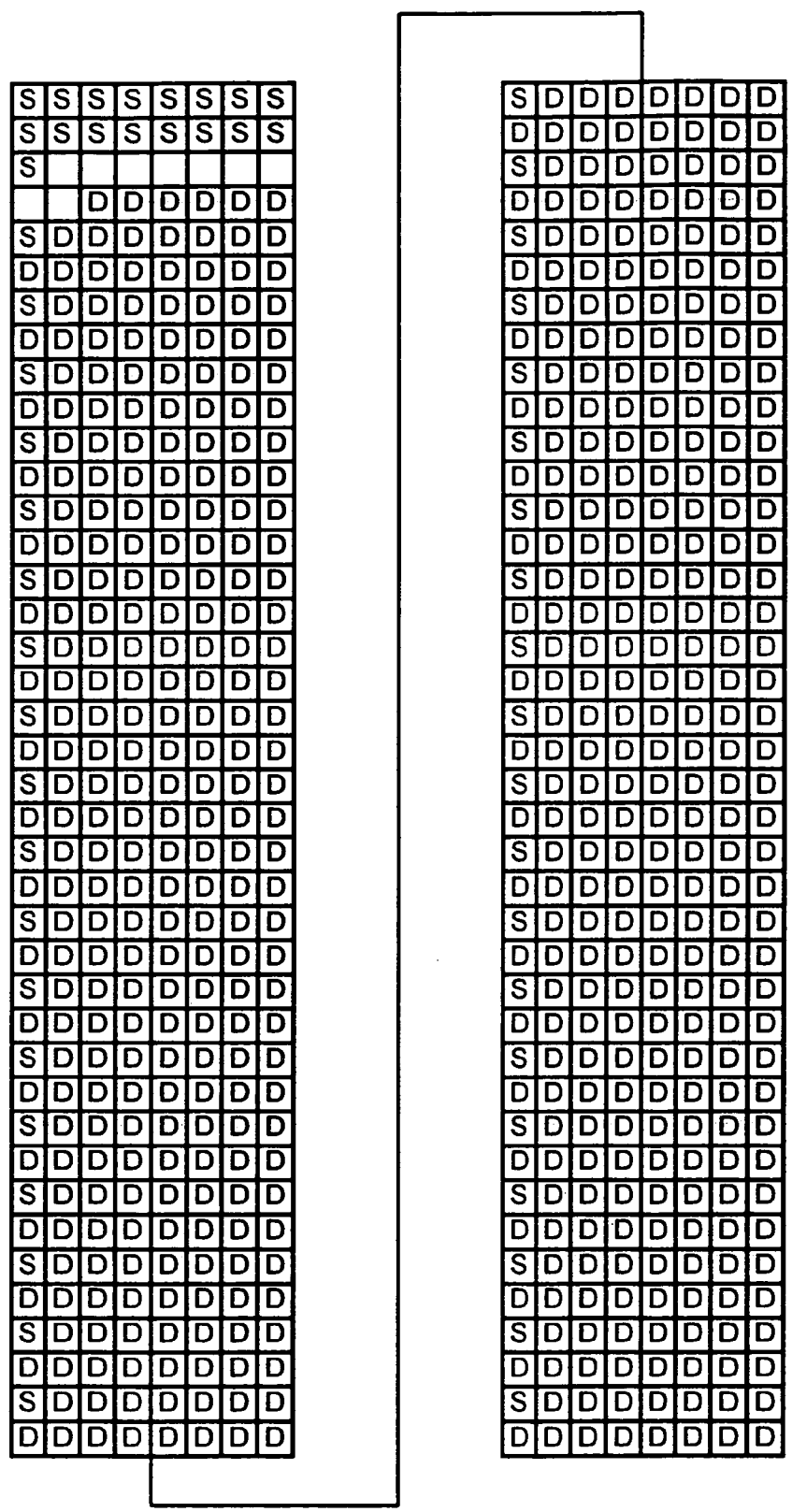
FIG. 5 illustrates a new frame generated from two TRAU frames.

FIG. 5 illustrates a new frame generated from two TRAU frames. The bits reserved for synchronizing are denoted by the letter S, the bits reserved for the user data with the letter D, and the control and spare bits have been left white. Each conventional TRAU frame has a four-octet-long synchronization and control part positioned at the beginning of the frame. When combining several frames, the control part may be reduced proportionally. If two frames are combined and transmitted together, a rate of 14.4 kbit/s requires 2*288 i.e. 576 bits per 40 ms. Two conventional frames in succession provide 2*270 bits, i.e. there are 36 bits lacking. In the solution according to the invention, the control part of the latter frame to be combined is used for data transmission. Furthermore, from the unused control bits of the first frame, 6 bits are used for data transmission. This will produce 576 bits in all, whereby there will still be 3 unused control bits. In the solution according to the invention, as shown by FIG. 5, a double length frame has at the beginning two full octets of synchronization bits, one synchronization bit at the beginning of the third octet, after which 8 control bits follow. After this, all the bits are data bits except the first bit in every other octet, this bit being reserved for synchronization.

Figure 6:
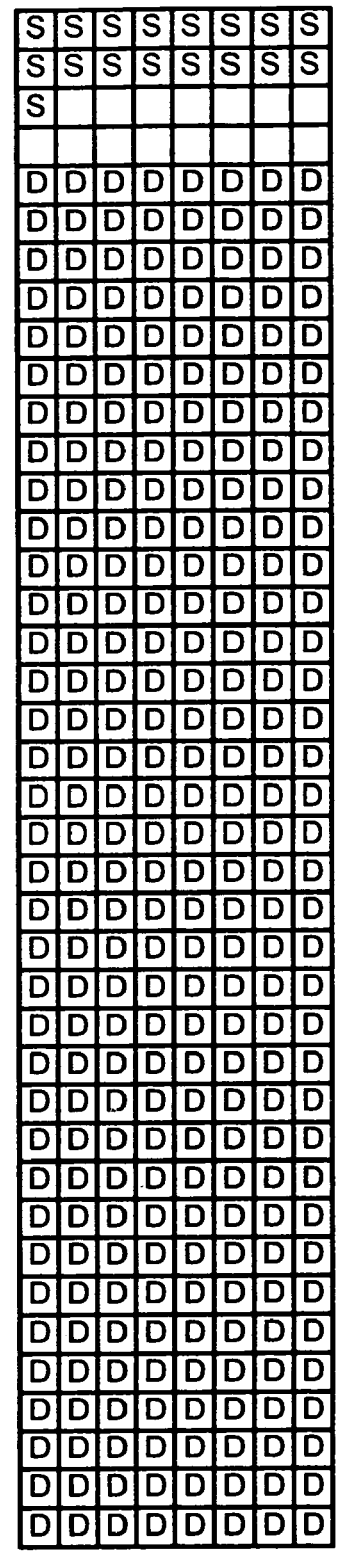
FIG. 6 illustrates a new type of TRAU frame.

FIG. 6 illustrates a new 20 ms TRAU frame. The bits reserved for synchronization are denoted by the letter S, the bits reserved for user data with the letter D, and the control and spare bits have been left white. In the solution according to this embodiment, following the control part all the bits are used for data transmission, including the first bit of every octet. In this manner, an adequate number of bits may be obtained for data transmission. A drawback concerning this solution is that the actual synchronization bits are all located at the beginning of the frame. In the solution according to the invention it is possible to improve the synchronization so that the transcoding frame is synchronized by using those bits of the frame which have a known value. Such bits are represented by frame type indicator bits (4 bits), a channel type indicator (1 bit) and an intermediate rate adaptation indicator (2 bits). By utilizing these bits, the functioning of the synchronization may be ensured. A second method according to the invention involves counting a short checksum for some of the data octets used for transferring the information to be transmitted, and transferring the CRC value thus obtained by using spare control bits, and utilizing the CRC value in synchronizing the transcoding frame.

It is yet another embodiment of the method according to the invention to use fill bits to break bit sequences consisting of the same bit: such sequences could otherwise be interpreted as TRAU frame synchronization patterns. One way is to use frames according to ITU recommendation V.42 or frames modified based on that. As the V.42 frames are so constructed that they do not contain long sequences of 1s, the user data must be inverted prior to transmission, and deinverted following the transmission in order for them not to contain long sequences of zeros.

Figure 7:
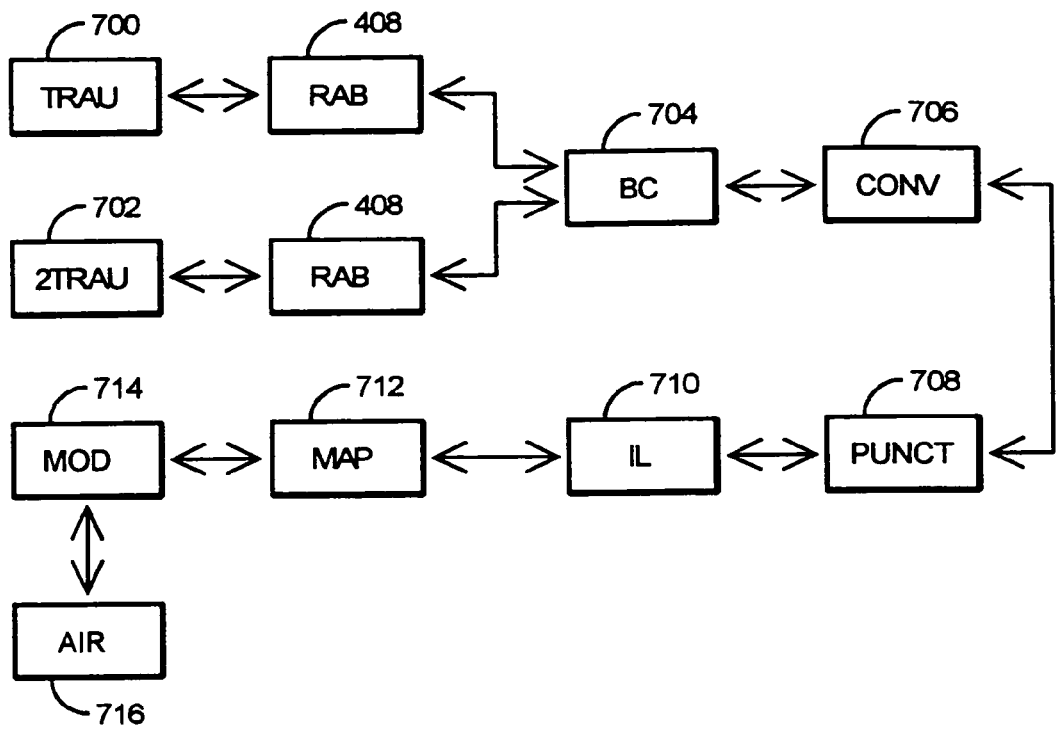
FIG. 7 illustrates implementing channel coding according to the invention.

In the following, the method of the invention will be examined in connection with channel coding. FIG. 7 offers a block diagram illustration of implementing channel coding according to the invention. The figure shows the two inventive transcoding frames, both the 20 ms frame 700 and the double length frame 702. In the 20 ms frame, 320 bits are transmitted during 20 ms, and 288 payload bits are rate adapted 408 to the rate of 14.4 kbit/s. In a similar manner, the double length frame comprises 640 bits during 40 ms, and 576 payload bits are rate adapted 408 to the rate of 14.4 kbit/s. Next, block coding 704 is carried out by using 288 bits as the size of the block in the solution according to the invention. In the block coding, 4 tail bits are added. Convolutional coding 706 is carried out at the coding rate of ½, by using the same GSM convolutional coding polynomes as at the data rate of 9.6 kbit/s.

$$G0=1+D^3+D^4$$

$$G1=1+D+D^3+D^4$$

Figure 8:
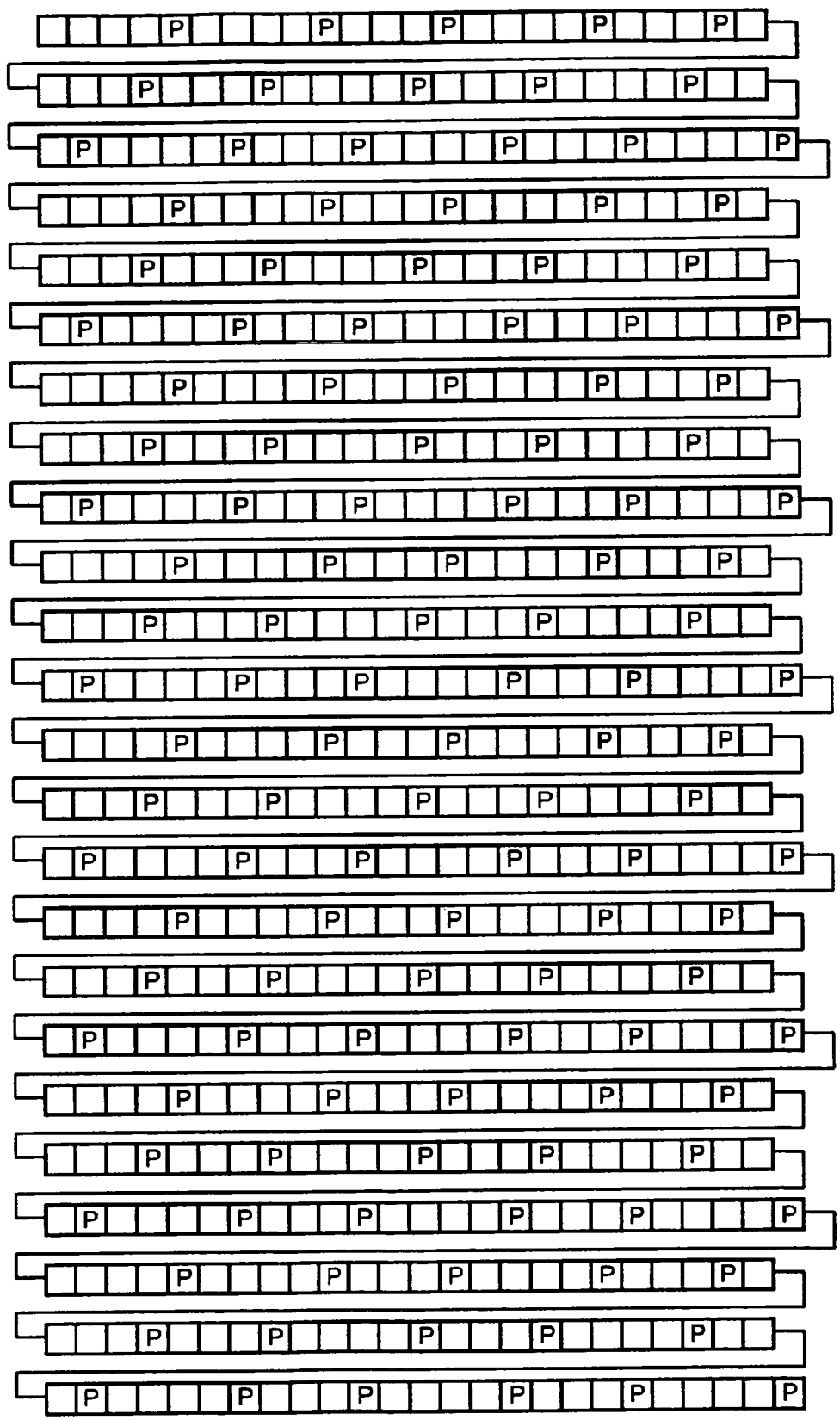
FIG. 8 illustrates a possible puncturing for the coded bits.

After the coding, 584 bits will thereby by obtained, out of which 128 bits will next 708 be punctured off, and the remaining 456 bits will be fed further to be interleaved 710, to burst formatting 712, to be modulated 714, and further to the radio path 716. The puncturing is illustrated in the example of FIG. 8, in which bits denoted with the letter P are deleted from the 584 bits obtained from the convolutional coding, whereby 456 bits remain.

Figure 9A:
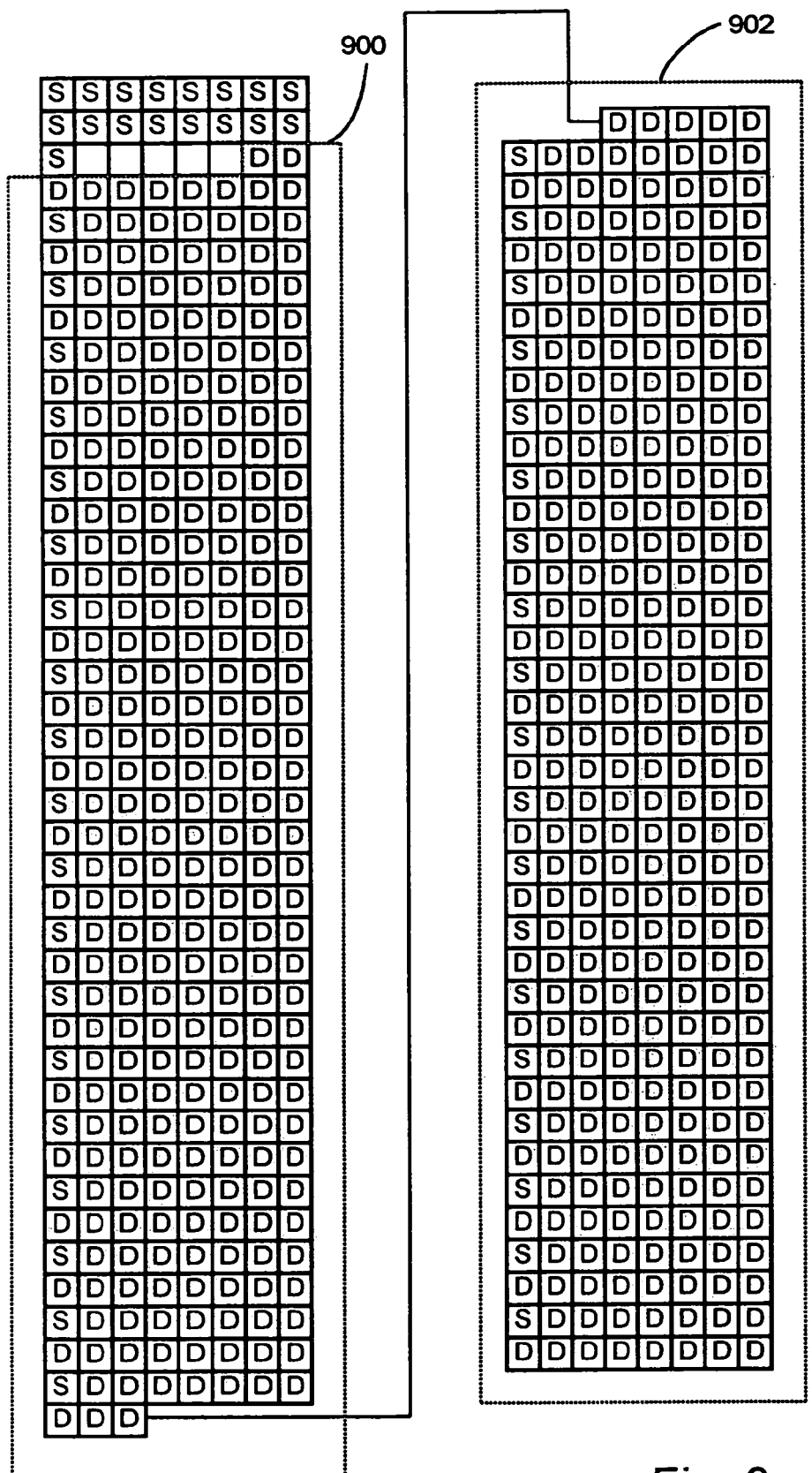
FIGS. 9a and 9b illustrate two frames of the new type.

Next, the second preferred embodiment according to the invention will be examined. In this embodiment, the information to be transmitted is transferred in the transfer system by generating a transcoding frame having a total length of 640 bits, and the information conveyed by which is applied to a channel coder as two blocks having the length of 290 bits. This is illustrated in FIG. 9a. The bits reserved for synchronization are denoted with the letter S, the bits assigned to the user data are denoted by D, and the control and spare bits have been left white. The frame therefore consists of the first 900 and the second 902 block.

Figure 9B:
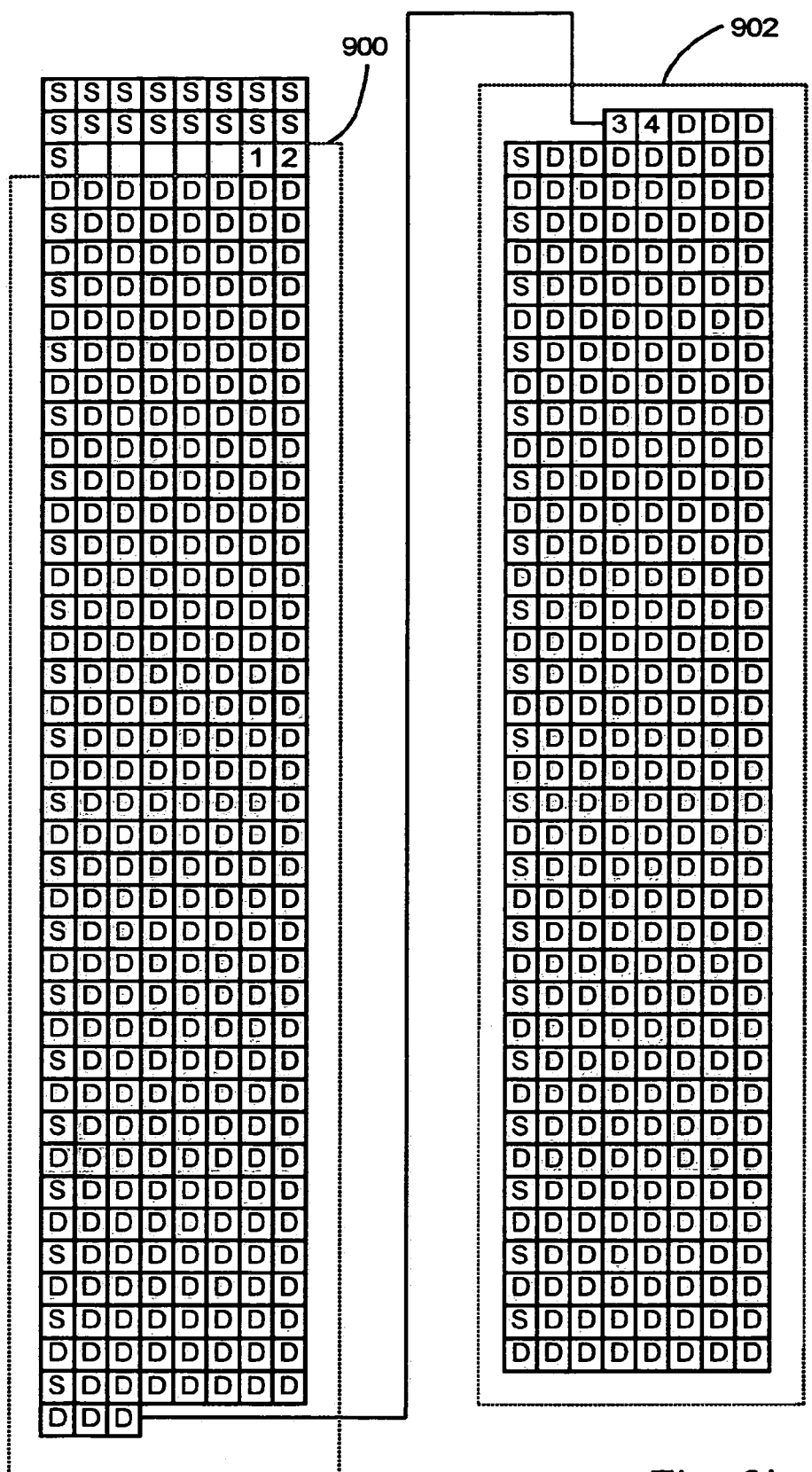

To both of the blocks, an identifier may be inserted which indicates whether the first or the second block of the frame is in question. The block identifier is in a predetermined position in the block, and the identifier of the second block is advantageously formed by inverting the identifier of the first block. The identifiers are illustrated in FIG. 9b. The identifiers may advantageously be located in bits 1 and 3. It is also possible to insert the identifiers only at the base station to the signal transmitted to the air interface.

The first bits 1, 2, 3 and 4 of both the blocks in the frame may advantageously be employed in transferring supplementary information over the air interface. Such supplementary information includes synchronization of half frames, sub-channel numbering or transferring inter-network synchronization information over the air interface. The supplementary information bits may also be used for signalling discontinuous transmission.

At the base station, the bit of the first block in the frame, indicating discontinuous transmission, may advantageously be replaced prior to channel coding by a fixed-value bit which is inverse to the bit transmitted at the same position in the latter block.

According to a preferred embodiment of the invention, channel coding comprises grouping bits to be transmitted into blocks having the size of 290 bits, adding 4 tail bits to the blocks, carrying out convolutional coding for said blocks with a ½ code rate by employing GSM convolutional polynomes so that after the coding the block size is 588 bits, and puncturing the coded bits obtained by deleting 132 bits from each block.

Figure 10:
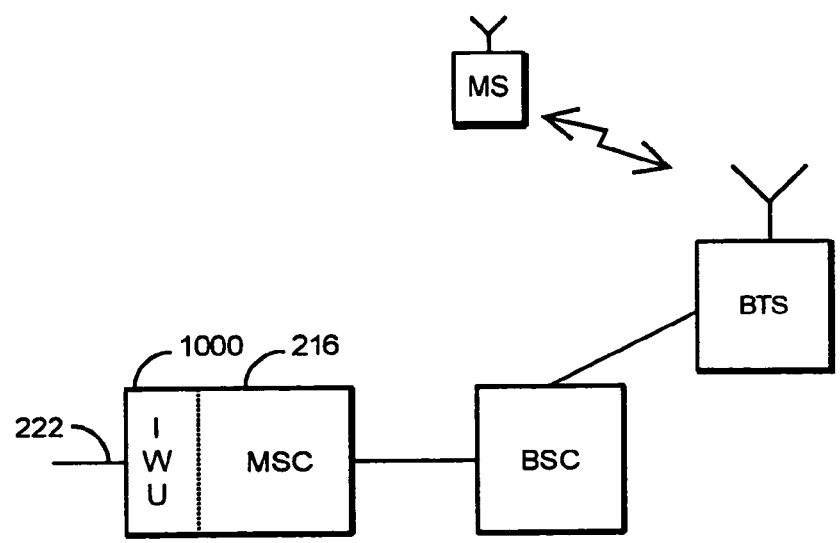
FIG. 10 illustrates a second example of a cellular radio system to which the method of the invention may be applied.

In the following, FIG. 10 will be examined which illustrates the structure of cellular radio systems of the GSM type. The figure shows a mobile station MS which communicates with a base station BTS. The base station BTS communicates via digital transmission links with a base station controller BSC which has one or more base stations under its control. The base station controller BSC, in turn, communicates via digital transmission links with a mobile services switching center MSC, which further has a connection via 222 a network interworking connection 1000 to other parts of the network.

As mentioned, the interface between the base station BTS and the base station controller is referred to as an Abis interface. The interface between the base station controller BTS and the mobile services switching center MSC is referred to as an A interface. In a solution according to a preferred embodiment of the invention, the transfer frame is generated at the network interworking unit 1000. The frame is transferred over the A interface, the TRAU receives and transmits the frame further, and the frame is transferred over the Abis interface, and the base station receives the frame. In a prior art solution, the frame is only generated in the TRAU at the base station controller. In the solution according to the present invention, the frame may also include a radio link protocol frame (RLP frame). This is an advantageous solution, as the amount of overhead decreases, there is no need to separate the RLP frames with a dedicated frame separator if the TRAU frame is of equal size.

Although the invention is in the above described with reference to the example of the accompanying drawings, it is obvious that it may be varied in many ways within the inventive idea set forth in the attached claims.

The invention claimed is:

1. A data transmission method in a digital cellular radio network, wherein information is transferred between network elements of the digital cellular radio network, the method comprising:
    increasing the data rate of transmission by channel coding the information to be transferred, the channel coding comprising
        grouping bits to be transmitted in blocks having a minimum size of 288 bits;
        carrying out convolutional coding for said blocks with a code rate of ½ by using GSM convolutional coding polynomes;
        puncturing the coded bits obtained, the puncturing including deleting bits from each block so that said each block contains no more than 456 bits;
        transferring the information to be transmitted in a transfer system by generating a transcoding frame having a plurality of data octets, the first two data octets forming a synchronization pattern that consists of zeros, and said transcoding frame containing control bits and at least 288 bits of information to be transmitted; and
        calculating a short checksum for some of the data octets used for transferring the information to be transmitted, transferring a cyclic redundancy check value obtained by using the spare control bits, and employing the cyclic redundancy check value in synchronizing of the transcoding frame.

2. The method as claimed in claim 1, further comprising employing bits of the frame that have a known value for synchronizing of the transcoding frame.

3. The method as claimed in claim 1, further comprising modifying the information to be transferred so that the bit sequences comprised by the information differ from the synchronization sequences.

4. A network element in a digital cellular radio network comprising a plurality of network elements, the network element being configured to increase the data rate of transmission by performing channel coding to information to be transferred between the network elements, the channel coding comprising:
    grouping bits to be transmitted in blocks having a minimum size of 288 bits;
    carrying out convolutional coding for said blocks with a code rate of ½ by using GSM convolutional coding polynomes;
    puncturing the coded bits obtained, the puncturing including deleting bits from each block so that said each block contains no more than 456 bits; and
    transferring the information to be transmitted in a transfer system by generating a transcoding frame having a plurality of data octets, the first two data octets forming a synchronization pattern that consists of zeros, and said transcoding frame containing control bits and at least 288 bits of information to be transmitted; and
    calculating a short checksum for some of the data octets used for transferring the information to be transmitted, transferring a cyclic redundancy check value obtained by using the spare control bits, and employing the cyclic redundancy check value in synchronizing of the transcoding frame, thus obtaining a frame having increased data transfer capability.

5. A digital cellular radio network comprising a plurality of network elements, comprising a network element being configured to increase the data rate of transmission by performing channel coding to information to be transferred for transmission between the network elements, the channel coding comprising:
    grouping bits to be transmitted in blocks having a minimum size of 288 bits;
    carrying out convolutional coding for said blocks with a code rate of ½ by using GSM convolutional coding polynomes;
    puncturing the coded bits obtained, the puncturing including deleting bits from each block so that said each block contains no more than 456 bits; and
    transferring the information to be transmitted in a transfer system by generating a transcoding frame having a plurality of data octets, the first two data octets forming a synchronization pattern that consists of zeros, and said transcoding frame containing control bits and at least 288 bits of information to be transmitted; and
    calculating a short checksum for some of the data octets used for transferring the information to be transmitted, transferring a cyclic redundancy check value obtained by using the spare control bits, and employing the cyclic redundancy check value in synchronizing of the transcoding frame, thus obtaining a frame having increased data transfer capability.

\* \* \* \* \*